(12) United States Patent
Huang et al.

(10) Patent No.: US 11,910,630 B2
(45) Date of Patent: Feb. 20, 2024

(54) WHITE LIGHT ORGANIC LIGHT-EMITTING DIODE (WOLED) DEVICES AND PREPARATION METHODS THEREOF, WOLED DISPLAY APPARATUSES

(71) Applicant: BOE Technology Group Co., Ltd., Beijing (CN)

(72) Inventors: Qingyu Huang, Beijing (CN); Fudong Chen, Beijing (CN); Huajie Yan, Beijing (CN); Wenqi Liu, Beijing (CN); Zhiqiang Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 265 days.

(21) Appl. No.: 17/359,603

(22) Filed: Jun. 27, 2021

(65) Prior Publication Data

US 2022/0020944 A1    Jan. 20, 2022

(30) Foreign Application Priority Data

Jul. 16, 2020 (CN) .......................... 202010685201.5

(51) Int. Cl.
*H10K 50/125* (2023.01)
*H10K 50/15* (2023.01)
*H10K 50/16* (2023.01)
*H10K 50/17* (2023.01)
*H10K 71/00* (2023.01)

(52) U.S. Cl.
CPC ........... *H10K 50/125* (2023.02); *H10K 50/15* (2023.02); *H10K 50/16* (2023.02); *H10K 50/17* (2023.02); *H10K 71/00* (2023.02)

(58) Field of Classification Search
None
See application file for complete search history.

(56) References Cited

U.S. PATENT DOCUMENTS

| 2015/0280158 A1 | 10/2015 | Ogiwara et al. |
| 2017/0256733 A1 | 9/2017 | Tsukamoto et al. |
| 2018/0047927 A1 | 2/2018 | Zhang et al. |

(Continued)

FOREIGN PATENT DOCUMENTS

| CN | 106206974 A | 12/2016 |
| CN | 106663743 A | 5/2017 |

(Continued)

OTHER PUBLICATIONS

CN2020106852015 first office action.

(Continued)

*Primary Examiner* — Daniel Whalen
(74) *Attorney, Agent, or Firm* — IPro, PLLC (57) ABSTRACT

The present application provides a WOLED device and a preparation method thereof, a WOLED display panel. The WOLED device includes: an anode; a cathode, disposed opposite to the anode; a red-fluorescence emitting layer, disposed on a side of the anode close to the cathode; a green-fluorescence emitting layer, disposed on a side of the red-fluorescence emitting layer close to the cathode; an interlayer, disposed on a side of the green-fluorescence emitting layer; and a blue-fluorescence emitting layer, disposed on a side of the interlayer close to the cathode.

19 Claims, 3 Drawing Sheets (56) References Cited

U.S. PATENT DOCUMENTS

2019/0081112 A1    3/2019  Tsukamoto et al.
2020/0028121 A1*   1/2020  Tanaka .................. H05B 33/12
2020/0067008 A1    2/2020  Mou
2021/0111305 A1    4/2021  Liu et al.

FOREIGN PATENT DOCUMENTS

| CN | 107256927 A  | 10/2017 |
| CN | 108807701 A  | 11/2018 |
| CN | 109659440 A  | 4/2019  |
| CN | 110190200 A  | 8/2019  |
| WO | 2014054452 A1| 4/2014  |
| WO | 2017191786 A1| 11/2017 |

OTHER PUBLICATIONS

Sun, Yiru, et al. "Management of singlet and triplet excitons for efficient white organic light-emitting devices." Nature 440.7086 (2006): 908-912.

* cited by examiner

WHITE LIGHT ORGANIC LIGHT-EMITTING DIODE (WOLED) DEVICES AND PREPARATION METHODS THEREOF, WOLED DISPLAY APPARATUSES

CROSS REFERENCE TO RELATED APPLICATIONS

This application claims priority to Chinese Patent Application No. 202010685201.5, titled "WOLED DEVICES AND PREPARATION METHODS THEREOF, WOLED DISPLAY APPARATUSES", filed on Jul. 16, 2020, the contents of all of which are incorporated herein by reference.

TECHNICAL FIELD

This application relates to the field of display technology, and in particular, to a WOLED device and a preparation method thereof, and a WOLED display apparatus.

BACKGROUND

T/E WOLED (white light organic light-emitting diode) has attracted wide attention in the field of organic flat panel display, due to advantages of high resolution, large aperture ratio and flexible substrate selection, especially in the field of high PPI (pixels per inch) micro-display. 1-stack WOLED, as a kind of WOLED currently available, has only one light-emitting center, which is different from a light-emitting structure whose pixels of three primary colors (RGB) emit light independently. Based on the one light-emitting center, 1-stack WOLED emits spectra of R, G, and B at a same time.

SUMMARY

In an aspect of the present application, a WOLED device is provided, including: an anode; a cathode, disposed opposite to the anode; a red-fluorescence emitting layer, disposed on a side of the anode close to the cathode; a green-fluorescence emitting layer, disposed on a side of the red-fluorescence emitting layer close to the cathode; an interlayer, disposed on a side of the green-fluorescence emitting layer close to the cathode, where the interlayer includes a first Host material and a first thermally activated delayed fluorescence (TADF) material; and a blue-fluorescence emitting layer, disposed on a side of the interlayer close to the cathode.

According to an embodiment of the present application, in emission spectra of the WOLED device, a width at 10%~15% of a main peak is greater than 230 nm.

According to an embodiment of the present application, in emission spectra of the WOLED device, a main peak is a first peak, and a wavelength of the first peak is less than 485 nm.

According to an embodiment of the present application, emission spectra of the WOLED device include a second peak in green-band, where a wavelength of the second peak is in a range of 510 nm~525 nm; the emission spectra of the WOLED device include a third peak and a fourth peak in red-band, where a wavelength of the third peak is in a range of 610 nm~625 nm, and a wavelength of the fourth peak is in a range of 656 nm~670 nm; or the emission spectra of the WOLED device include a fifth peak in red-band, and a wavelength of the fifth peak is in a range of 580 nm~670 nm.

According to an embodiment of the present application, the first Host material includes at least one of CBP or mCBP, and the first TADF material includes at least one of 2CzPN, 4CzIPN or 4CzTPN.

According to an embodiment of the present application, in the interlayer, a mass ratio of the first Host material and the first TADF material is in a range of 1:9~9:1.

According to an embodiment of the present application, a thickness of the interlayer is in a range of 0.5 nm~20 nm.

According to an embodiment of the present application, the blue-fluorescence emitting layer, the green-fluorescence emitting layer and the red-fluorescence emitting layer respectively have a thickness of 0.5 nm~20 nm.

According to an embodiment of the present application, the blue-fluorescence emitting layer has one of the following configurations: the blue-fluorescence emitting layer includes a second Host material and a second TADF material; the blue-fluorescence emitting layer includes a third Host material, a third TADF material and a first blue dopant (BD) material; or the blue-fluorescence emitting layer includes a blue host (BH) material and a second BD material.

According to an embodiment of the present application, based on a total mass of the blue-fluorescence emitting layer, in terms of mass percent, the blue-fluorescence emitting layer has one of the following configurations: the blue-fluorescence emitting layer includes 1%~50% of the second Host material and the second TADF material accounting for a remaining amount; the blue-fluorescence emitting layer includes 3%~7% of the first BD material, 1%~50% of the third Host material, and the third TADF material accounting for a remaining amount; or the blue-fluorescence emitting layer includes 5%~10% of the second BD material, and the BH material accounting for a remaining amount.

According to an embodiment of the present application, when the blue-fluorescence emitting layer includes the second Host material and the second TADF material, the blue-fluorescence emitting layer and the interlayer form an integral structure, or a two-layer structure.

According to an embodiment of the present application, the green-fluorescence emitting layer includes a fourth TADF material and a green dopant (GD) material, and the red-fluorescence emitting layer includes a fifth TADF material and a red dopant (RD) material.

According to an embodiment of the present application, the WOLED device further includes: a hole injection layer, disposed between the anode and the red-fluorescence emitting layer; a hole transport layer, disposed on a side of the hole injection layer close to the cathode; and an electron transport layer, disposed on a side of the blue-fluorescence emitting layer close to the cathode, where an electron mobility of the electron transport layer is in a range of $1\times10^{-5}$~$1\times10^{-4}$ $cm^2/V\cdot s$, and a hole mobility of the hole transport layer is in a range of $1\times10^{-5}$~$1\times10^{-4}$ $cm^2/V\cdot s$.

According to an embodiment of the present application, chromatic coordinates of emission spectra of the WOLED device are (a, b), a is in a range of 0.2~0.4, and b is in a range of 0.2~0.4.

In another aspect of the present application, a preparation method of a WOLED device is provided, including: forming a red-fluorescence emitting layer on a side of an anode by a first evaporation; forming a green-fluorescence emitting layer on a side of the red-fluorescence emitting layer away from the anode by a second evaporation; forming an interlayer on a side of the green-fluorescence emitting layer away from the anode by a third evaporation, where the interlayer includes a first Host material and a first TADF material; forming a blue-fluorescence emitting layer on a side of the interlayer away from the anode by a fourth evaporation; and forming a cathode on a side of the blue-fluorescence emitting layer away from the anode by a fifth evaporation.

According to an embodiment of the present application, the preparation method further includes: forming a hole injection layer on a side of the anode close to the cathode by a sixth evaporation; forming a hole transport layer on a side of the hole injection layer close to the cathode by a seventh evaporation; and forming an electron transport layer on a side of the blue-fluorescence emitting layer close to the cathode by an eighth evaporation.

According to an embodiment of the present application, evaporation rates of the first evaporation, the second evaporation, the third evaporation, the fourth evaporation, the fifth evaporation, the sixth evaporation, the seventh evaporation and the eighth evaporation respectively are in a range of 0.8 Å/s~3 Å/s.

According to an embodiment of the present application, during the first evaporation, the second evaporation, the third evaporation, the fourth evaporation, the fifth evaporation, the sixth evaporation, the seventh evaporation and the eighth evaporation, vacuums of chamber are respectively set at $3 \times 10^{-6}$ Torr or less than $3 \times 10^{-6}$ Torr.

In another aspect of the present application, a WOLED display apparatus is provided, including the WOLED device mentioned above.

DETAILED DESCRIPTION OF THE EMBODIMENTS

Embodiments of the present application are described in detail below. The embodiments described below are exemplary, and only used to explain the present application, but should not be construed as limiting this application. Means or conditions not specified in the embodiments shall be carried out in accordance with means or conditions in the literature of this field or in accordance with product specifications. Reagents or materials used herein without manufacturer's indication are all conventional products that can be commercially purchased.

WOLED (white light organic light-emitting diode) has attracted wide attention in the field of organic flat panel display, due to advantages of high resolution, large aperture ratio and flexible substrate selection, especially in the field of high PPI (pixels per inch) micro-display. Currently, 2-stack WOLED is a mainstream structure of WOLED. Although 2-stack WOLED can emit white light with a high luminance and a low power consumption, it still has problems such as greater crosstalk and higher cost. 1-stack WOLED has less layers, a short production cycle, and high productivity, but a relatively low luminance, which corresponds to the needs for low-luminance products.

At present, all fluorescent WOLED and fluorescent-phosphorescent hybrid WOLED (hybrid WOLED) are two main structures of 1-stack WOLED. The all fluorescent WOLED has a stable lifespan, but a relatively low efficiency, and it has a theoretical IQE (internal quantum efficiency) of about 25%. By contrast, the fluorescent-phosphorescent hybrid WOLED has a higher efficiency, but a relatively shorter lifespan caused by quenching of triplet excitons.

Figure 1:
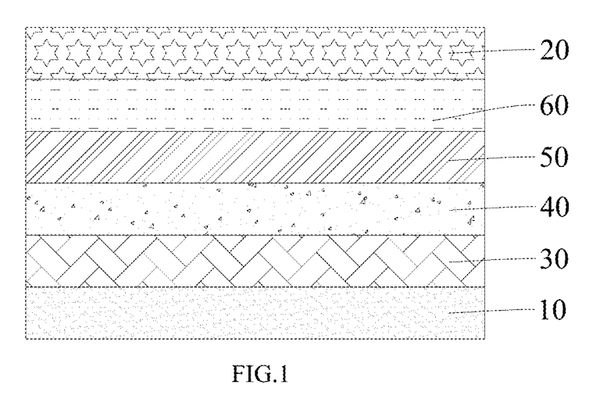
FIG. 1 is a schematic structure diagram of a WOLED device according to an embodiment of the present application.

In an aspect of the present application, a WOLED device is provided. According to an embodiment of the present application, referring to FIG. 1, the WOLED device includes: an anode 10; a cathode 20, disposed opposite to the anode 10; a red-fluorescence emitting layer 30, disposed on a side of the anode 10 close to the cathode 20; a green-fluorescence emitting layer 40, disposed on a side of the red-fluorescence emitting layer 30 close to the cathode 20; an interlayer 50, disposed on a side of the green-fluorescence emitting layer 40 close to the cathode 20, where the interlayer 50 includes a first Host material and a first thermally activated delayed fluorescence material (TADF) material; and a blue-fluorescence emitting layer 60, disposed on a side of the interlayer 50 close to the cathode 20. Thus, the WOLED device is a 1-stack WOLED. The first Host material and the first TADF material included in the interlayer 50 both have a high triplet state (T1) and a high singlet state (S1). In a TADF material, an energy gap ($\Delta E_{ST}$) between the T1 and S1 levels is small to less than 100 meV, and with support of thermal energy, T1 excitons can be converted to S1 excitons by reverse ISC (intersystem crossing). Thus, the TADF material can convert the T1 excitons, which cannot be transitioned to emit light, to the S1 excitons, thereby achieving an IQE of 100%. Then, the S1 excitons formed in the interlayer transfer energy to the adjacent blue-fluorescence emitting layer, red-fluorescence emitting layer and green-fluorescence emitting layer by FRET (Förster resonance energy transfer) to make them respectively emit blue, red and green light, so as to emit white light by emitting spectra of R, G, and B at a same time based on one light-emitting center. Therefore, based on the mechanism of emitting light, the WOLED device, as an all fluorescent 1-stack WOLED, has a longer lifespan, a simple structure, and a lower manufacturing cost.

Figure 6:
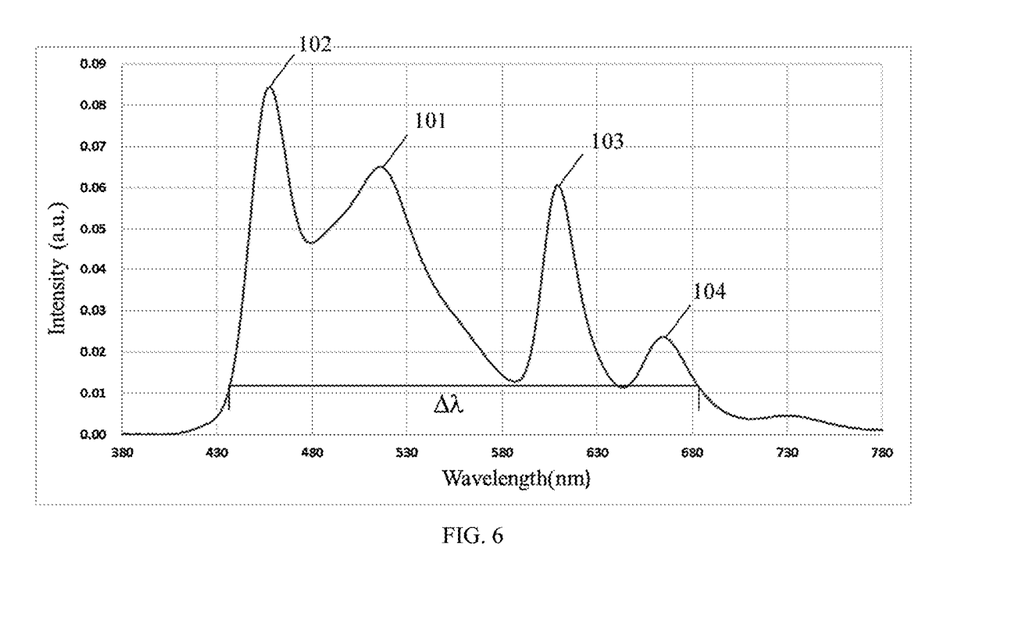
FIG. 6 is emission spectra of the WOLED device according to an embodiment of the present application.

According to an embodiment of the present application, emission spectra of the WOLED device include at least two peaks. In some embodiments, the emission spectra of the WOLED device include two peaks respectively in blue-band and yellow-band. In some embodiments, the emission spectra of the WOLED device include three peaks respectively in blue-band, red-band and green-band. In some embodiments, the emission spectra of the WOLED device include four peaks. As shown in FIG. 6, in an embodiment, the emission spectra of the WOLED device include a peak in blue-band, a peak in green-band and two peaks in red-band. Therefore, the WOLED device according to the present application has a high current efficiency.

According to an embodiment of the present application, as shown in FIG. 6, in the emission spectra of the WOLED device, a width ($\Delta\lambda$) at 10%~15% of a main peak is greater than 230 nm. Therefore, the WOLED device according to the present application has relatively wide emission spectra and can be used to prepare a WOLED apparatus with a wide color gamut.

According to an embodiment of the present application, as shown in FIG. 6, the main peak (which is in blue-band)

of the WOLED device is a first peak 102, and a wavelength of the first peak 102 is not greater than 485 nm (such as 480 nm, 475 nm, 470 nm, 465 nm or 460 nm). Therefore, the WOLED device has a high color temperature.

According to an embodiment of the present application, the emission spectra of the WOLED device include a second peak 101 in green-band, and a wavelength of the second peak 101 is in the range of 510 nm~525 nm. Therefore, the wavelength of the second peak is close to a wavelength of a peak in the human visual curve, thereby endowing the WOLED device with a higher luminous efficiency. It should be understood that the luminous efficiency generally refers to a current efficiency, that is, luminance of light brought about by a unit of current. In some embodiments, the emission spectra of the WOLED device include a third peak 103 and a fourth peak 104 both in red-band, where a wavelength of the third peak 103 is in the range of 610 nm~625 nm, and a wavelength of the fourth peak 104 is in the range of 656 nm~670 nm (as shown in FIG. 6). In some other embodiments, the emission spectra of the WOLED device only include a fifth peak in red-band, and a wavelength of the fifth peak is in the range of 580 nm~670 nm. WOLED devices with the emission spectra mentioned above can effectively emit white light.

According to an embodiment of the present application, materials of the anode and the cathode are not restricted, and those skilled in the art may choose flexibly according to actual conditions. In some embodiments, the anode is made of ITO, thereby the anode having a better light transmittance, which helps to improve light utilization of the device, where a sheet resistance of the anode is 30Ω/☐ or less than 30Ω/☐. In some embodiments, the material of the cathode is selected from metal, such as aluminum or silver.

According to an embodiment of the present application, the first Host material is selected from, but not limited to, at least one of CBP (4,4'-bis(9H-carbazol-9-yl)-1,1'-biphenyl) or mCBP (3,3'-bis(9H-carbazol-9-yl)-1,1'-biphenyl), and the first TADF material is selected from, but not limited to, at least one of 2CzPN (4,5-bis(9H-carbazol-9-yl)-1,2-dicyanobenzene), 4CzIPN (2,4,5,6-tetra(9H-carbazol-9-yl)-1,3-dicyanobenzene) or 4CzTPN (2,3,5,6-tetra(carbazol-9-yl)-1,4-dicyanobenzene).

According to an embodiment of the present application, in the interlayer, a mass ratio of the first Host material and the first TADF material is in the range of 1:9~9:1, such as 1:9, 1:8, 1:6, 1:5, 1:3, 1:1, 2:1, 3:1, 5:1, 7:1 or 9:1, which helps to realize a 100% IQE effectively.

According to an embodiment of the present application, a thickness of the interlayer is in the range of 0.5 nm~20 nm, such as 0.5 nm, 2 nm, 5 nm, 8 nm, 10 nm, 13 nm, 15 nm, 17 nm, or 20 nm. Thus, setting the thickness of the interlayer within the above range can adjust the extent to which excitons diffuse to the blue-fluorescence emitting layer, the red-fluorescence emitting layer and the green-fluorescence emitting layer, thereby adjusting luminous intensity of the blue, red and green light.

According to an embodiment of the present application, thicknesses of the blue-fluorescence emitting layer, the red-fluorescence emitting layer and the green-fluorescence emitting layer may respectively be in the range of 0.5 nm~20 nm, such as 0.5 nm, 1 nm, 2 nm, 5 nm, 8 nm, 10 nm, 13 nm, 15 nm, 17 nm or 20 nm. Thus, setting the thicknesses of the blue-fluorescence emitting layer, the red-fluorescence emitting layer and the green-fluorescence emitting layer within the above range can adjust the luminous intensity of the blue, red and green light.

According to an embodiment of the present application, the blue-fluorescence emitting layer has one of the following configurations.

In some embodiments, the blue-fluorescence emitting layer includes a second Host material and a second TADF material. In some embodiments, based on a total mass of the blue-fluorescence emitting layer, in terms of mass percent, the second Host material accounts for 1%~50% and the second TADF material accounts for the remaining amount. This enables the blue-fluorescence emitting layer to emit blue light with a desired intensity.

When the blue-fluorescence emitting layer includes the second Host material and the second TADF material, the blue-fluorescence emitting layer and the interlayer may be an integral structure (i.e., a single-layer structure), or each may be a separate layer (i.e., a two-layer structure). When the blue-fluorescence emitting layer and the interlayer are integrated, one evaporation procedure can be saved, thereby reducing costs and simplifying production process.

Moreover, the second Host material includes but is not limited to at least one of CBP or mCBP, and the second TADF material includes but is not limited to at least one of 2CzPN, 4CzIPN or 4CzTPN.

In some other embodiments, the blue-fluorescence emitting layer includes a third Host material, a third TADF material and a first blue dopant (BD) material. In some embodiments, based on the total mass of the blue-fluorescence emitting layer, in terms of mass percent, the first BD material accounts for 3%~7%, the third Host material accounts for 1%~50%, and the third TADF material accounts for the remaining amount. This enables the blue-fluorescence emitting layer to emit blue light with a desired intensity.

The third Host material is selected from, but not limited to, at least one of CBP or mCBP, the third TADF material is selected from, but not limited to, at least one of 2CzPN, 4CzIPN or 4CzTPN, and the first BD material includes but is not limited to BCzVBi (4,4'-bis(9-ethyl-3-carbazovinylene)-1,1'-biphenyl).

In some other embodiments, the blue-fluorescence emitting layer includes a Blue Host (BH) material and a second BD material. Based on the total mass of the blue-fluorescence emitting layer, in terms of mass percent, the second BD material accounts for 5%~10%, the BH material accounts for the remaining amount. This enables the blue-fluorescence emitting layer to emit blue light with a desired intensity.

The BH material includes but is not limited to MADN (2-methyl-9,10-bis(naphthalen-2-yl)anthracene), and the second BD material includes but is not limited to BCzVBi.

According to an embodiment of the present application, the green-fluorescence emitting layer includes a fourth TADF material and a green dopant (GD) material, and the red-fluorescence emitting layer includes a fifth TADF material and a red dopant (RD) material. This enables the green-fluorescence emitting layer to emit green light with appropriate intensity, and enables the red-fluorescence emitting layer to emit red light with appropriate intensity.

The fourth TADF material includes but is not limited to CBP, and the GD material includes but is not limited to $Alq_3$ (tris(8-hydroxyquinoline)aluminum). The fifth TADF material includes but is not limited to m-MTDATA(4,4',4"-tris[(3-methylphenyl)phenylamino]triphenylamine), and the RD material includes but is not limited to rubene.

Figure 2:
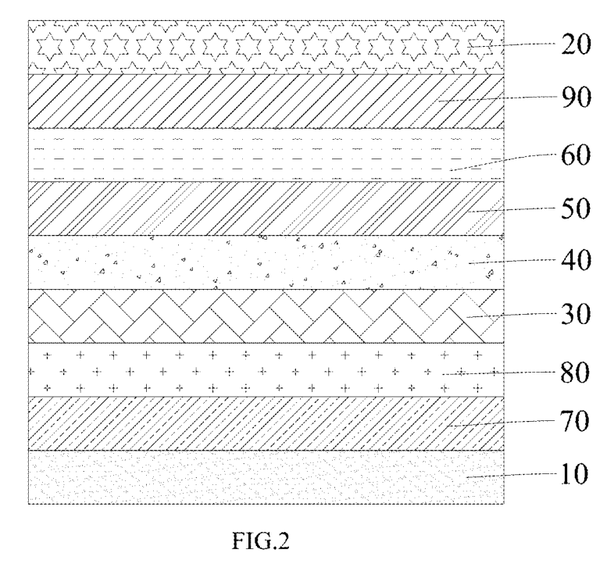
FIG. 2 is a schematic structure diagram of a WOLED device according to another embodiment of the present application.

According to an embodiment of the present application, as shown in FIG. 2, the WOLED device further includes: a hole injection layer 70, disposed on a side of the anode 10 close to the cathode 20; a hole transport layer 80, disposed on a side of the hole injection layer 70 close to the cathode 20; and an electron transport layer 90, disposed on a side of the blue-fluorescence emitting layer 60 close to the cathode 20.

According to an embodiment of the present application, the hole injection layer includes but is not limited to PEDOT:PSS (poly(3,4-ethylenedioxythiophene) poly(styrene sulfonate)), the hole transport layer includes but is not limited to m-MTDATA, and the electron transport layer includes but is not limited to 3TPYMB (tris(2,4,6-trimethyl-3-(pyridin-3-yl)phenyl)borane).

According to an embodiment of the present application, electron mobility of the electron transport layer is in the range of $1\times10^{-5}\sim1\times10^{-4}$ cm$^2$/V·s (such as $1\times10^{-5}$ cm$^2$/V·s, $2\times10^{-5}$ cm$^2$/V·s, $3\times10^{-5}$ cm$^2$/V·s, $4\times10^{-5}$ cm$^2$/V·s, $5\times10^{-5}$ cm$^2$/V·s, $6\times10^{-5}$ cm$^2$/V·s, $7\times10^{-5}$ cm$^2$/V·s, $8\times10^{-5}$ cm$^2$/V·s, $9\times10^{-5}$ cm$^2$/V·s or $1\times10^{-4}$ cm$^2$/V·s), and hole mobility of the hole transport layer is in the range of $1\times10^{-5}\sim1\times10^{-4}$ cm$^2$/V·s (such as $1\times10^{-5}$ cm$^2$/V·s, $2\times10^{-5}$ cm$^2$/V·s, $3\times10^{-5}$ cm$^2$/V·s, $4\times10^{-5}$ cm$^2$/V·s, $5\times10^{-5}$ cm$^2$/V·s, $6\times10^{-5}$ cm$^2$/V·s, $7\times10^{-5}$ cm$^2$/V·s, $8\times10^{-5}$ cm$^2$/V·s, $9\times10^{-5}$ cm$^2$/V·s or $1\times10^{-4}$ cm$^2$/V·s). Thus, having the electron mobility and the hole mobility within the above range helps to form a plurality of excitons at an interface of the interlayer to emit white light of better intensity.

Figure 3:
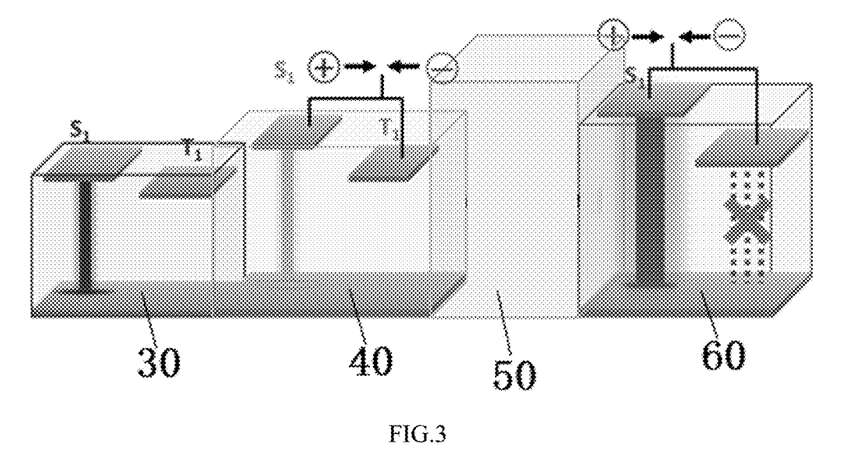
FIG. 3 is a schematic diagram of exciton diffusion mechanism of the WOLED device according to the present application.
Figure 4:
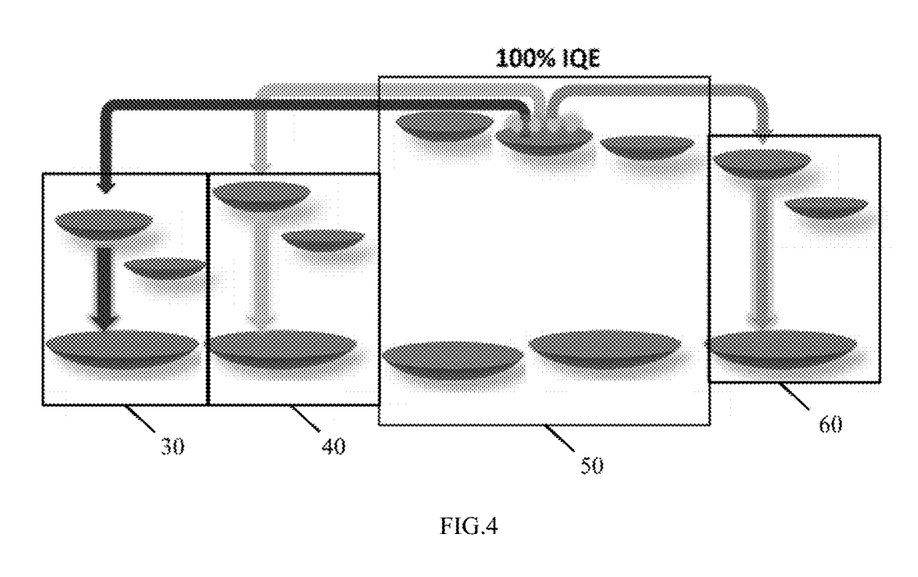
FIG. 4 is a schematic diagram of energy transfer of the WOLED device according to the present application.
Figure 5:
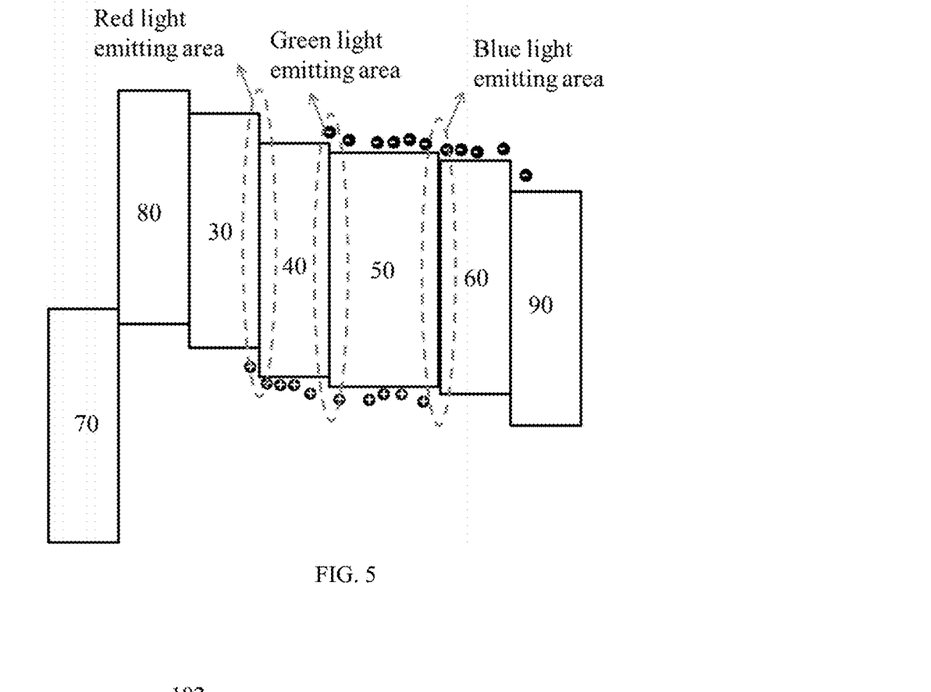
FIG. 5 is a schematic diagram of light-emitting area of the WOLED device according to the present application.

According to an embodiment of the present application, mechanism of exciton diffusion and energy transfer in the WOLED device are referred to FIG. 3, FIG. 4, and FIG. 5. In the WOLED device, electrons and holes are injected from the cathode and the anode respectively, and then meet at an interface of the interlayer to form excitons. The interlayer includes the first Host material and the first TADF material. A Host material and a TADF material have opposite carrier transport characteristics, but both have a higher triplet state (T1) and a higher singlet state (S1). T1 and S1 of the TADF material have higher energy than S1 of the RD, GD and BD material. The red-fluorescence emitting layer and the green-fluorescence emitting layer are disposed on a side of the interlayer, and the blue-fluorescence emitting layer is disposed on another side of the interlayer. The red-fluorescence emitting layer and the green-fluorescence emitting layer both use a TADF material as a host and is doped with a RD material and a GD material, respectively. Compared with the red-fluorescence emitting layer and the green-fluorescence emitting layer, the blue-fluorescence emitting layer uses a Host material or a BH material with a higher energy state as a host and is doped with a BD material to emit blue light. The S1 excitons formed in the interlayer transfer energy to the adjacent blue-fluorescence emitting layer, red-fluorescence emitting layer and green-fluorescence emitting layer by FRET to make them respectively emit blue, red and green light. It should be understood that the arrows in FIG. 4 indicate radiation transition after the S1 excitons in the interlayer transfers energy.

According to an embodiment of the present application, chromatic coordinates of the WOLED device are (a, b), where a is in the range of 0.2~0.4, and b is in the range of 0.2~0.4. For example, the chromatic coordinates of the WOLED device are (0.2, 0.4), (0.3, 0.4), (0.4, 0.2), (0.28, 0.34) or (0.30, 0.33). This indicates that the WOLED device of the present application emits white light.

According to an embodiment of the present application, the WOLED device further includes an anode modification layer and a cathode modification layer to respectively improve injection efficiency of the holes and the electrons, where the anode modification layer is disposed on a side of the anode close to the cathode, and the cathode modification layer is disposed on a side of the cathode close to the anode. Among them, the material of the anode modification layer may be PEDOT:PSS, and the material of the cathode modification layer may be LiF (lithium fluoride).

In an embodiment of this application, a WOLED device D1 includes:
- an anode, made of ITO, and having a sheet resistance of less than 30 Ω/□;
- an anode modification layer made of PEDOT:PSS;
- a hole injection layer made of PEDOT:PSS, and having a thickness of 30 nm;
- a hole transport layer made of m-MTDATA, and having a thickness of 30 nm and a hole mobility of $8\times10^{-5}$ cm$^2$/V·s;
- a red-fluorescence emitting layer, including a fifth TADF material and a RD material, and having a thickness of 5 nm, where the fifth TADF material is m-MTDATA, the RD material is rubene, and a mass percentage of rubene in the red-fluorescence emitting layer is 5%;
- a green-fluorescence emitting layer, including a fourth TADF material and a GD material, and having a thickness of 5 nm, where the fourth TADF material is CBP, the GD material is Alq$_3$, and a mass percentage of Alq$_3$ in the green-fluorescence emitting layer is 5%;
- an interlayer, including a first Host material and a first TADF material, and having a thickness of 5 nm, where the first Host material is mCBP, the first TADF material is 2CzPN, and a mass percentage of 2CzPN in the interlayer is 20%;
- a blue-fluorescence emitting layer, including a BH material and a second BD material, and having a thickness of 20 nm, where the BH material is MADN, the second BD material is BCzVBi, and a mass percentage of BCzVBi in the blue-fluorescence emitting layer is 5%;
- an electron transport layer made of 3TPYMB, having a thickness of 35 nm and an electron mobility of $1\times10^{-5}$ cm$^2$/V·s;
- a cathode modification layer made of LiF, and having a thickness of 1 nm; and
- a cathode made of aluminum, and having a thickness of 100 nm.

In this embodiment, a light-emitting area of the WOLED device D1 is 2 mm×2 mm, and emission spectra of the WOLED device D1 are shown in FIG. 6. The chromatic coordinates corresponding to the spectra are (0.28, 0.34), and the WOLED device has a maximum current efficiency of 27.3 Cd/A and an LT80 of 100 hours at a current density of 50 mA/cm$^2$.

In another embodiment of this application, a WOLED device D2 includes:
- an anode made of ITO, and having a sheet resistance of less than 30 ω/□;
- an anode modification layer made of PEDOT:PSS;
- a hole injection layer made of PEDOT:PSS, and having a thickness of 30 nm;
- a hole transport layer made of m-MTDATA, and having a thickness of 30 nm, and a hole mobility of $8\times10^{-5}$ cm$^2$/V·s;
- a red-fluorescence emitting layer, including a fifth TADF material and a RD material, and having a thickness of 5 nm, where the fifth TADF material is m-MTDATA, the RD material is rubene, and a mass percentage of rubene in the red-fluorescence emitting layer is 5%;
- a green-fluorescence emitting layer, including a fourth TADF material and a GD material, and having a thickness of 5 nm, where the fourth TADF material is CBP, the GD material is Alq$_3$, and a mass percentage of Alq$_3$ in the green-fluorescence emitting layer is 5%;

an interlayer, including a first Host material and a first TADF material, and having a thickness of 5 nm, where the first Host material is mCBP, the first TADF material is 2CzPN, and a mass percentage of 2CzPN in the interlayer is 20%;

a blue-fluorescence emitting layer, including a second Host material and a second TADF material, and having a thickness of 20 nm, where the second Host material is mCBP, the second TADF material is 2CzPN, and a mass percentage of 2CzPN in the blue-fluorescence emitting layer is 10%;

an electron transport layer made of 3TPYMB, and having a thickness of 35 nm and an electron mobility of $1 \times 10^{-5}$ cm$^2$/V·s;

a cathode modification layer made of LiF, and having a thickness of 1 nm; and a cathode made of aluminum, and having a thickness of 100 nm.

In this embodiment, a light-emitting area of the WOLED device D2 is 2 mm×2 mm.

In another embodiment of this application, a WOLED device D3 includes:

an anode made of ITO, and having a sheet resistance less than 30 Ω/□;

an anode modification layer made of PEDOT:PSS;

a hole injection layer made of PEDOT:PSS, and having a thickness of 30 nm;

a hole transport layer made of m-MTDATA, and having a thickness of 30 nm, and a hole mobility of $8 \times 10^{-5}$ cm2/V·s;

a red-fluorescence emitting layer, including a fifth TADF material and a RD material, and having a thickness of 5 nm, where the fifth TADF material is m-MTDATA, the RD material is rubene, and a mass percentage of rubene in the red-fluorescence emitting layer is 5%;

a green-fluorescence emitting layer, including a fourth TADF material and a GD material, and having a thickness of 5 nm, where the fourth TADF material is CBP, the GD material is Alq$_3$, and a mass percentage of Alq$_3$ in the green-fluorescence emitting layer is 5%;

an interlayer, including a first Host material and a first TADF material, and having a thickness of 5 nm, where the first Host material is mCBP, the first TADF material is 2CzPN, and a mass percentage of 2CzPN in the interlayer is 20%;

a blue-fluorescence emitting layer, including a third Host material, a third TADF material and a first BD material, and having a thickness of 20 nm, where the third Host material is mCBP, the third TADF material is 2CzPN, the first BD material is BCzVBi, a mass percentage of 2CzPN is 20% and a mass percentage of BCzVBi is 5%;

an electron transport layer made of 3TPYMB, having a thickness of 35 nm and an electron mobility of $1 \times 10^{-5}$ cm$^2$/V·s;

a cathode modification layer made of LiF, and having a thickness of 1 nm; and a cathode made of aluminum, and having a thickness of 100 nm.

In this specific embodiment, a light-emitting area of the WOLED device D3 is 2 mm×2 mm.

It should be noted that in the above three embodiments, the WOLED devices are encapsulated, that is, the devices are coated with UV curing adhesive around their periphery, and then placed under a UV lamp of 265 nm to be irradiated for 20~25 minutes.

In another aspect of this application, a preparation method of the WOLED device mentioned above is provided. According to an embodiment of this application, the preparation method of the WOLED device includes:

S100: a red-fluorescence emitting layer is formed on a side of an anode by a first evaporation, where the anode may be formed by photolithography, and is to be rinsed in deionized water, acetone, and absolute ethanol in sequence under ultrasound, and then dried with nitrogen blow down, and performed with oxygen plasma treatment;

S200: a green-fluorescence emitting layer is formed on a side of the red-fluorescence emitting layer away from the anode by a second evaporation;

S300: an interlayer is formed on a side of the green-fluorescence emitting layer away from the anode by a third evaporation, where the interlayer includes a first Host material and a first TADF material;

S400: a blue-fluorescence emitting layer is formed on a side of the interlayer away from the anode by a fourth evaporation;

S500: a cathode is formed on a side of the blue-fluorescence emitting layer away from the anode by a fifth evaporation.

According to an embodiment of the present application, the preparation method of the WOLED device further includes:

S600: a hole injection layer is formed on a side of the anode close to the cathode by a sixth evaporation;

S700: a hole transport layer is formed on a side of the hole injection layer close to the cathode by a seventh evaporation;

S800: an electron transport layer is formed on a side of the blue-fluorescence emitting layer close to the cathode by an eighth evaporation.

According to an embodiment of the present application, evaporation rates of the first evaporation, the second evaporation, the third evaporation, the fourth evaporation, the fifth evaporation, the sixth evaporation, the seventh evaporation and the eighth evaporation respectively are in the range of 0.8 Å/s~3 Å/s, such as 0.8 Å/s, 1 Å/s, 1.2 Å/s, 1.4 Å/s, 1.6 Å/s, 1.8 Å/s, 2.0 Å/s, 2.2 Å/s, 2.4 Å/s, 2.6 Å/s, 2.8 Å/s or 3.0 Å/s. Thus, the anode, the cathode, the RGB fluorescence emitting layers, the electron transport layer, the hole transport layer, and the interlayer can be prepared with a better performance and a uniform thickness.

According to an embodiment of the present application, during the first evaporation, the second evaporation, the third evaporation, the fourth evaporation, the fifth evaporation, the sixth evaporation, the seventh evaporation and the eighth evaporation, vacuums of chamber are respectively set to be $3 \times 10^{-6}$ Torr or less than $3 \times 10^{-6}$ Torr, such as $3 \times 10^{-6}$ Torr, $2 \times 10^{-6}$ Torr, $1 \times 10^{-6}$ Torr, $0.5 \times 10^{-6}$ Torr or $0.1 \times 10^{-6}$ Torr. Thus, the anode, the cathode, the RGB fluorescence emitting layers, the electron transport layer, the hole transport layer, and the interlayer can be prepared with a better performance, and side reactions during the evaporations can be decreased.

In some embodiments, during the fifth evaporation, a metal mask is used, and the evaporation rate is controlled to be 3.0 Å/s. During the first evaporation, the second evaporation, the third evaporation, the fourth evaporation, the sixth evaporation, the seventh evaporation and the eighth evaporation, an open mask is used, and the evaporation rates are controlled to be 1.0 Å/s.

According to the embodiments of the present application, a WOLED device prepared with this method is a 1-stack WOLED, where the interlayer includes a first Host material and a first TADF material, which both have a higher triplet state (T1) and a higher singlet state (S1). In a TADF material, an energy gap ($\Delta E_{ST}$) between the T1 and S1 state is small to less than 100 meV, and with support of thermal energy, T1 excitons can be converted to S1 excitons by reverse ISC. Thus, the TADF material can convert the T1 excitons, which cannot be transitioned to emit light, to the S1 excitons. Then, the S1 excitons formed transfer energy to the adjacent blue-fluorescence emitting layer, the red-fluorescence emitting layer and the green-fluorescence emitting layer to emit light, thereby achieving a 100% IQE in theory. Therefore, based on the light-emitting mechanism, the WOLED device is an all fluorescent light-emitting device, which has a longer lifespan, a simple structure and a lower cost.

In another aspect of this application, a WOLED display apparatus is provided, including the WOLED device mentioned above. Thus, the WOLED display apparatus has advantages of long lifespan and high luminance. Those skilled in the art should understand that the WOLED display apparatus has all the features and advantages of the WOLED device mentioned above, which are not repeated here.

According to an embodiment of the present application, specific types of the WOLED display apparatus are not limited, and may be flexibly decided by those skilled in the art according to actual needs. In some embodiments, the specific types of the WOLED display apparatus include a mobile phone, a tablet, an electronic paper, a laptop, a gaming console or any display apparatus with a display function.

Those skilled in the art should understand that besides the WOLED device mentioned above, the WOLED display apparatus further includes all essential structures or components of an ordinary WOLED display apparatus. Taking a mobile phone as an example of the WOLED display apparatus, it further includes a display backplane, a color filter substrate, a cover glass, a housing, a touch panel, an audio module, one or more camera modules, one or more CPUs, and other essential structures and components.

The terms "first" and "second" in the specification are only used for descriptive purpose, and should not be understood as indicating or implying relative importance or implicitly indicating a number of technical features indicated. Thus, the features defined with "first" and "second" may explicitly or implicitly include one or more of these features. In the description of the present application, "a plurality of" means two or more than two, unless otherwise specifically defined.

In the description of this specification, description with reference to the terms "an embodiment", "some embodiments", "examples", "specific examples", or "some examples" etc. means that the specific features, structures, materials or characteristics described in an embodiment or example are included in at least one embodiment or example of the present application. In this specification, the schematic representations of the above terms do not necessarily refer to a same embodiment or example. Moreover, the described specific features, structures, materials or characteristics can be combined in any one or more embodiments or examples in a suitable manner. In addition, those skilled in the art can combine or compose the different embodiments or examples and the features of the different embodiments or examples described in this specification without contradicting each other.

Although the embodiments of this application are shown and described above, it can be understood that the above embodiments are exemplary and should not be construed as limitations of this application. Those skilled in the art can make changes, modifications, substitutions and variants to the above-mentioned embodiments within the scope of this application.

The invention claimed is:

1. A white light organic light-emitting diode (WOLED) device, comprising:
   an anode;
   a cathode, disposed opposite to the anode;
   a red-fluorescence emitting layer, disposed on a side of the anode close to the cathode;
   a green-fluorescence emitting layer, disposed on a side of the red-fluorescence emitting layer close to the cathode;
   an interlayer, disposed on a side of the green-fluorescence emitting layer close to the cathode, wherein the interlayer comprises a first Host material and a first thermally activated delayed fluorescence (TADF) material; and
   a blue-fluorescence emitting layer, disposed on a side of the interlayer close to the cathode; wherein
   emission spectra of the WOLED device comprise a first peak which is a main peak, wherein a peak wavelength of the first peak is not greater than 485 nm;
   the emission spectra of the WOLED device comprise a second peak in green-band, wherein a peak wavelength of the second peak is in a range of 510 nm~525 nm;
   the emission spectra of the WOLED device comprise a third peak and a fourth peak in red-band, wherein a peak wavelength of the third peak is in a range of 610 nm~625 nm, and a peak wavelength of the fourth peak is in a range of 656 nm~670 nm; and
   magnitudes of the first peak, the second peak, the third peak and the fourth peak are descending.

2. The WOLED device of claim 1, wherein in the emission spectra of the WOLED device, a width at 10%-15% of the first peak is greater than 230 nm.

3. The WOLED device of claim 1, wherein the first Host material comprises at least one of CBP or mCBP, and the first TADF material comprises at least one of 2CzPN, 4CzIPN or 4CzTPN.

4. The WOLED device of claim 1, wherein in the interlayer, a mass ratio of the first Host material and the first TADF material is in a range of 1:9~9:1.

5. The WOLED device of claim 1, wherein a thickness of the interlayer is in a range of 0.5 nm~20 nm.

6. The WOLED device of claim 1, wherein the blue-fluorescence emitting layer, the green-fluorescence emitting layer and the red-fluorescence emitting layer respectively have a thickness of 0.5 nm~20 nm.

7. The WOLED device of claim 1, wherein the blue-fluorescence emitting layer has one of the following configurations:
   the blue-fluorescence emitting layer comprises a second Host material and a second TADF material;
   the blue-fluorescence emitting layer comprises a third Host material, a third TADF material and a first blue dopant (BD) material; or
   the blue-fluorescence emitting layer comprises a blue host (BH) material and a second BD material.

8. The WOLED device of claim 7, wherein based on a total mass of the blue-fluorescence emitting layer, in terms of mass percent, the blue-fluorescence emitting layer has one of the following configurations:
- the blue-fluorescence emitting layer comprises 1%~50% of the second Host material and the second TADF material accounting for a remaining amount;
- the blue-fluorescence emitting layer comprises 3%~7% of the first BD material, 1%~50% of the third Host material, and the third TADF material accounting for a remaining amount; or
- the blue-fluorescence emitting layer comprises 5%~10% of the second BD material, and the BH material accounting for a remaining amount.

9. The WOLED device of claim 7, wherein when the blue-fluorescence emitting layer comprises the second Host material and the second TADF material, the blue-fluorescence emitting layer and the interlayer form an integral structure, or a two-layer structure.

10. The WOLED device of claim 1, wherein the green-fluorescence emitting layer comprises a fourth TADF material and a green dopant (GD) material, and the red-fluorescence emitting layer comprises a fifth TADF material and a red dopant (RD) material.

11. The WOLED device of claim 1, further comprising:
- a hole injection layer, disposed between the anode and the red-fluorescence emitting layer;
- a hole transport layer, disposed on a side of the hole injection layer close to the cathode; and
- an electron transport layer, disposed on a side of the blue-fluorescence emitting layer close to the cathode, wherein an electron mobility of the electron transport layer is in a range of $1\times10^{-5}$~$1\times10^{-4}$ cm$^2$/V·s, and a hole mobility of the hole transport layer is in a range of $1\times10^{-5}$~$1\times10^{-4}$ cm$^2$/V a.

12. The WOLED device of claim 1, wherein chromatic coordinates of the emission spectra of the WOLED device are (a, b), a is in a range of 0.2~0.4, and b is in a range of 0.2~0.4.

13. A white light organic light-emitting diode (WOLED) display apparatus, comprising the WOLED device of claim 1.

14. The WOLED device of claim 1, wherein a valley between the second peak and the third peak is close to 0 and substantially level with a valley between the third peak and the fourth peak.

15. A preparation method of a white light organic light-emitting diode (WOLED) device, comprising:
- forming a red-fluorescence emitting layer on a side of an anode by a first evaporation;
- forming a green-fluorescence emitting layer on a side of the red-fluorescence emitting layer away from the anode by a second evaporation;
- forming an interlayer on a side of the green-fluorescence emitting layer away from the anode by a third evaporation, wherein the interlayer comprises a first Host material and a first TADF material;
- forming a blue-fluorescence emitting layer on a side of the interlayer away from the anode by a fourth evaporation; and
- forming a cathode on a side of the blue-fluorescence emitting layer away from the anode by a fifth evaporation; wherein
- emission spectra of the WOLED device comprise a first peak which is a main peak, wherein a peak wavelength of the first peak is not greater than 485 nm;
- the emission spectra of the WOLED device comprise a second peak in green-band, wherein a peak wavelength of the second peak is in a range of 510 nm~525 nm;
- the emission spectra of the WOLED device comprise a third peak and a fourth peak in red-band, wherein a peak wavelength of the third peak is in a range of 610 nm~625 nm, and a peak wavelength of the fourth peak is in a range of 656 nm~670 nm; and
- magnitudes of the first peak, the second peak, the third peak and the fourth peak are descending.

16. The preparation method of claim 15, further comprising:
- forming a hole injection layer on a side of the anode close to the cathode by a sixth evaporation;
- forming a hole transport layer on a side of the hole injection layer close to the cathode by a seventh evaporation; and
- forming an electron transport layer on a side of the blue-fluorescence emitting layer close to the cathode by an eighth evaporation.

17. The preparation method of claim 16, wherein evaporation rates of the first evaporation, the second evaporation, the third evaporation, the fourth evaporation, the fifth evaporation, the sixth evaporation, the seventh evaporation and the eighth evaporation respectively are in a range of 0.8 Å/s~3 Å/s.

18. The preparation method of claim 16, wherein during the first evaporation, the second evaporation, the third evaporation, the fourth evaporation, the fifth evaporation, the sixth evaporation, the seventh evaporation and the eighth evaporation, vacuums of chamber are respectively set at $3\times10^{-6}$ Torr or less than $3\times10^{-6}$ Torr.

19. The preparation method of claim 15, wherein a valley between the second peak and the third peak is close to 0 and substantially level with a valley between the third peak and the fourth peak.

\* \* \* \* \*